United States Patent [19]

Jennings et al.

[11] Patent Number: 4,910,160

[45] Date of Patent: Mar. 20, 1990

[54] HIGH VOLTAGE COMPLEMENTARY NPN/PNP PROCESS

[75] Inventors: Dean Jennings, Sunnyvale; Matthew S. Buynoski, Palo Alto, both of Calif.

[73] Assignee: National Semiconductor Corporation, Santa Clara, Calif.

[21] Appl. No.: 361,171

[22] Filed: Jun. 6, 1989

[51] Int. Cl.[4] .............................................. H01L 19/00
[52] U.S. Cl. ......................................... 437/31; 437/8; 437/12; 437/82; 357/48
[58] Field of Search .................... 437/31, 8, 12, 82; 357/48

[56] References Cited

U.S. PATENT DOCUMENTS

| | | | |
|---|---|---|---|
| 3,702,428 | 11/1972 | Schmitz | 437/31 |
| 3,901,735 | 8/1975 | Dunkley | 437/32 |
| 3,956,035 | 5/1976 | Hermann | 437/31 |
| 4,038,680 | 7/1977 | Yagi | 437/31 |
| 4,110,782 | 8/1978 | Nelson | 437/31 |
| 4,299,024 | 11/1981 | Pialrouski | 437/31 |
| 4,512,816 | 4/1985 | Ramde | 437/31 |
| 4,534,806 | 8/1985 | Nhadgo | 437/31 |
| 4,616,405 | 10/1986 | Yasnoka | 437/31 |
| 4,641,419 | 2/1987 | Kudo | 437/31 |
| 4,719,185 | 1/1988 | Goth | 437/31 |

Primary Examiner—Brian E. Hearn
Assistant Examiner—Anthony Gutierrey
Attorney, Agent, or Firm—Gail W. Woodward; Lee Patch

[57] ABSTRACT

A process is disclosed for forming high-performance, high voltage PNP and NPN power transistors in a conventional monolithic, planar, epitaxial PNP junction isolated integrated circuit. The process permits independently optimizing the NPN and PNP power trransitors. Where high-voltage devices are desired a field threshold adjustment implant is applied. It also includes provisions for testing critical portions of the process at appropriate points.

8 Claims, 5 Drawing Sheets

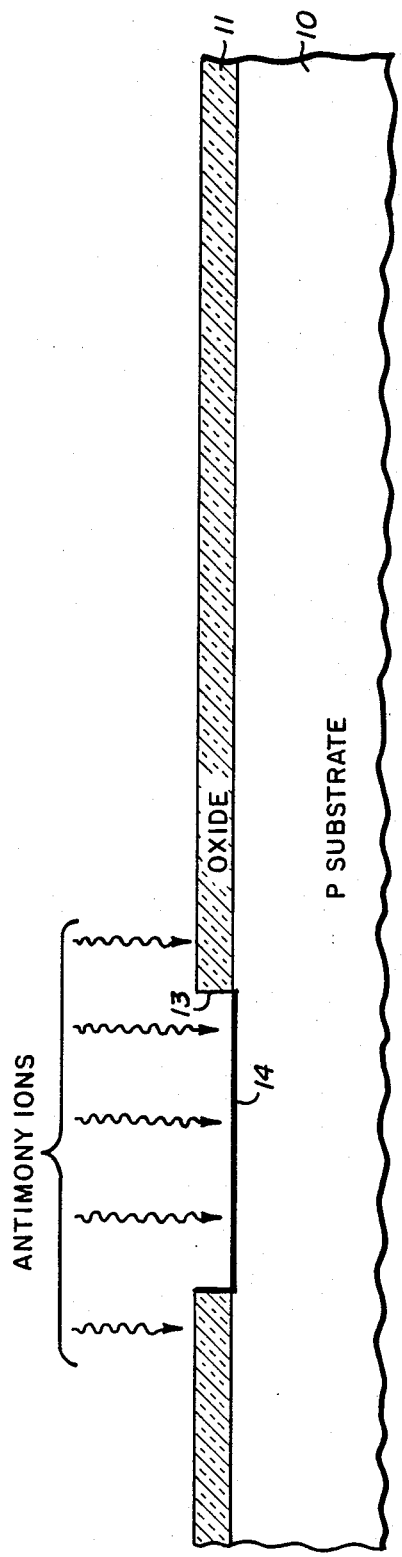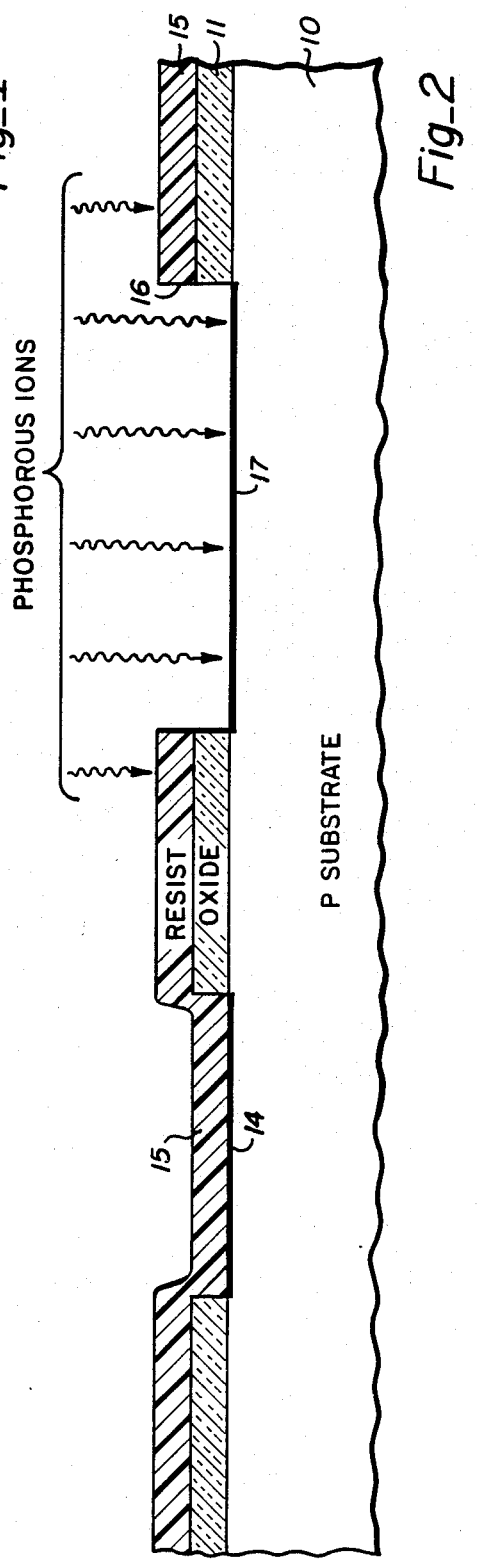

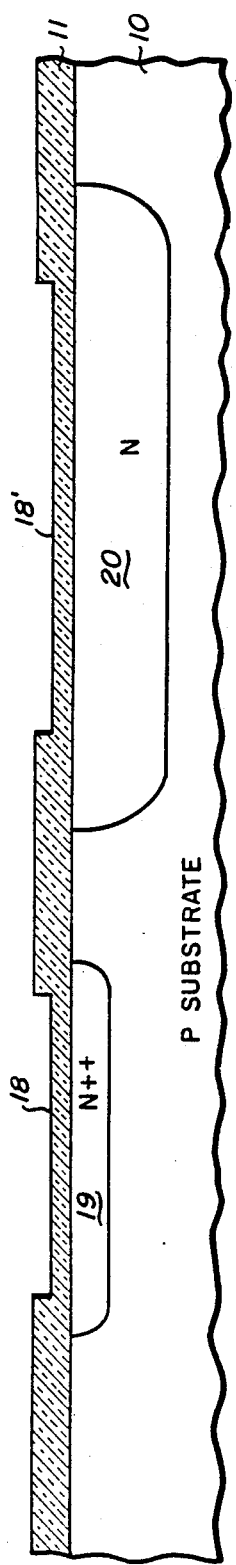
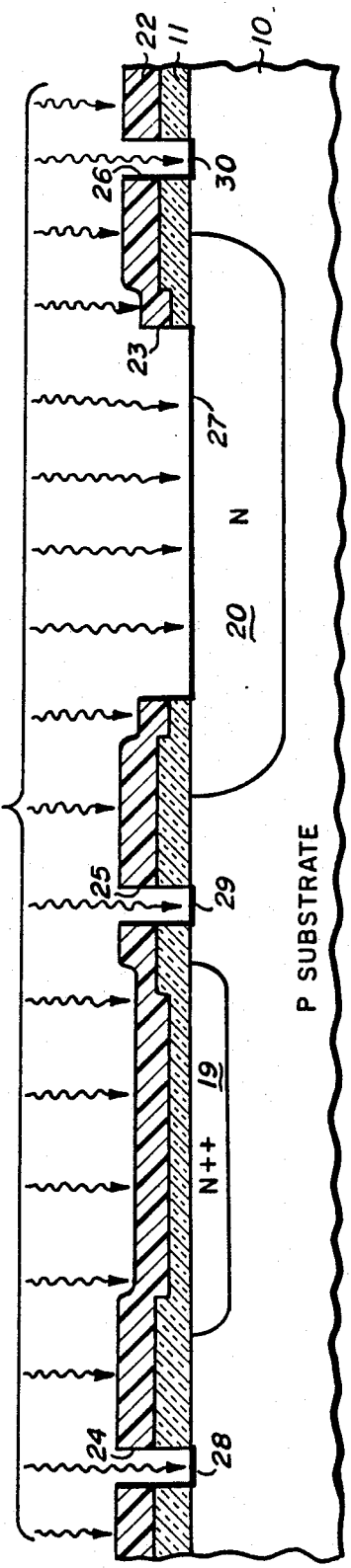
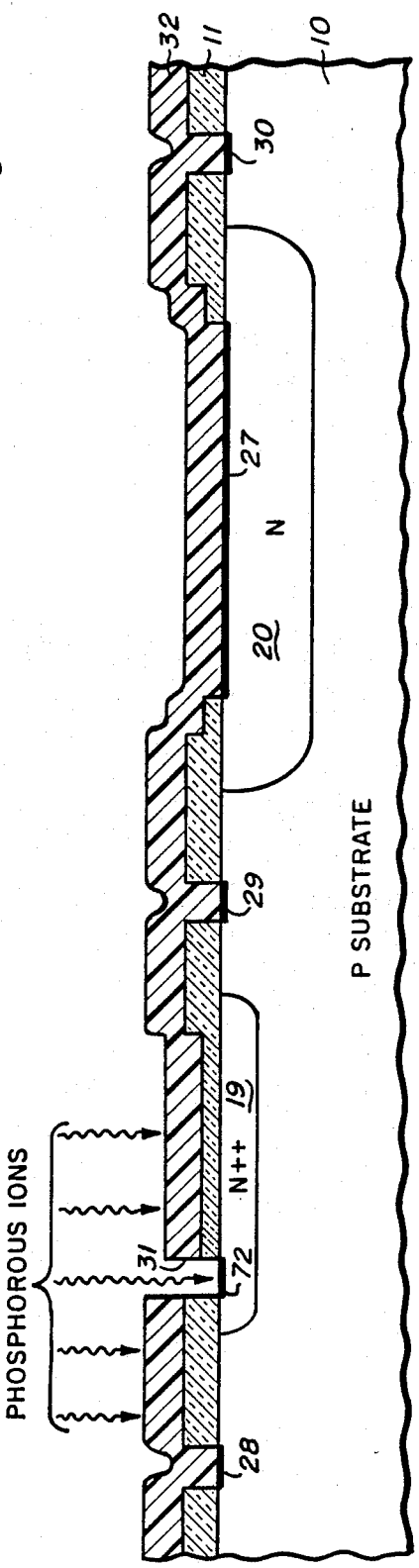

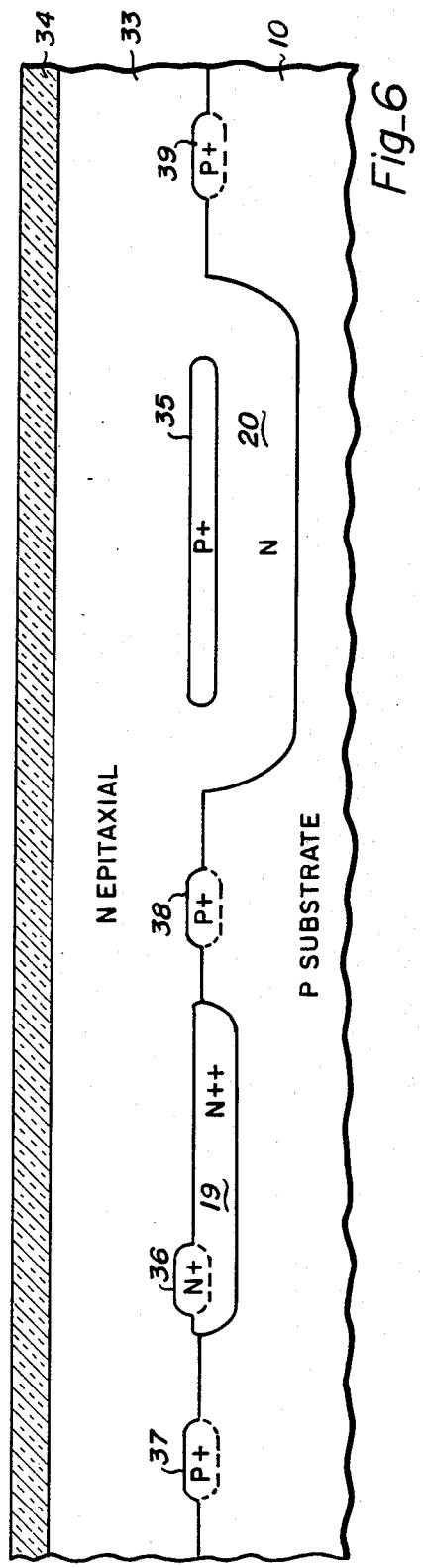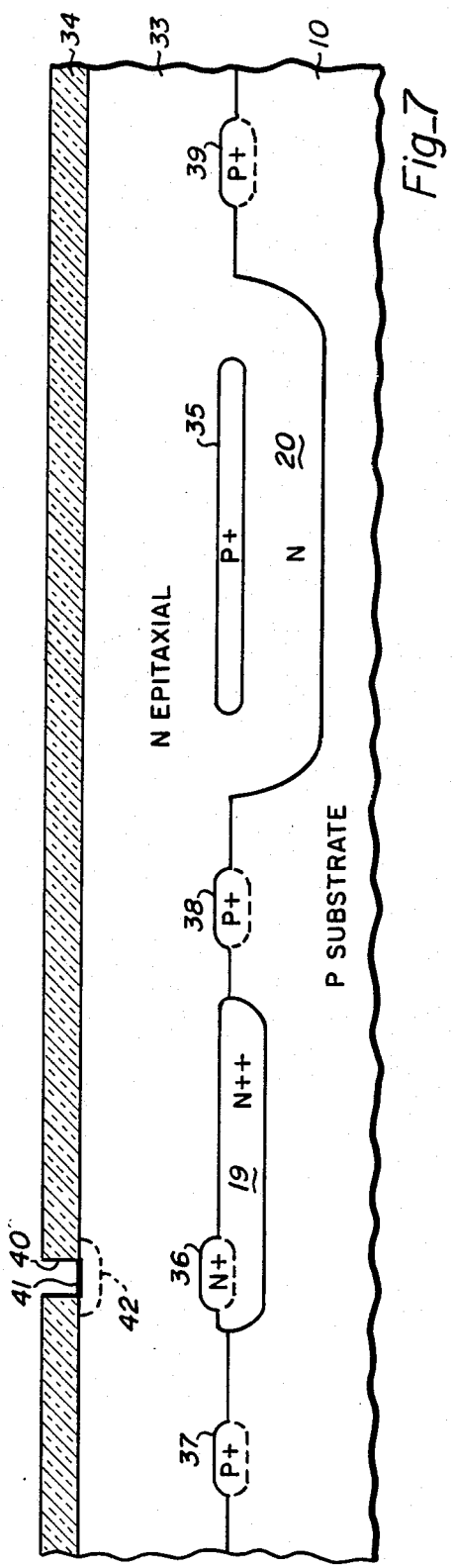

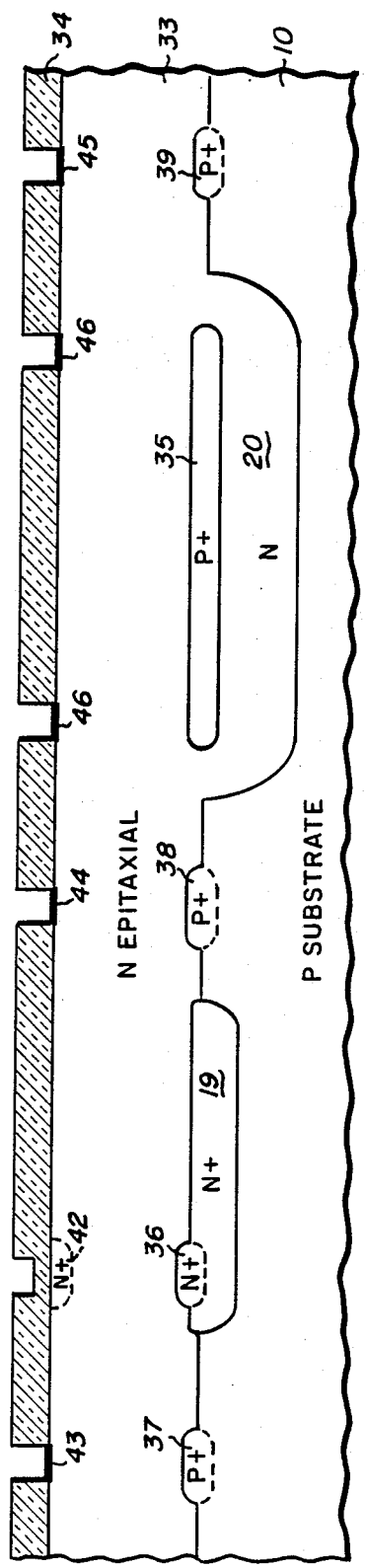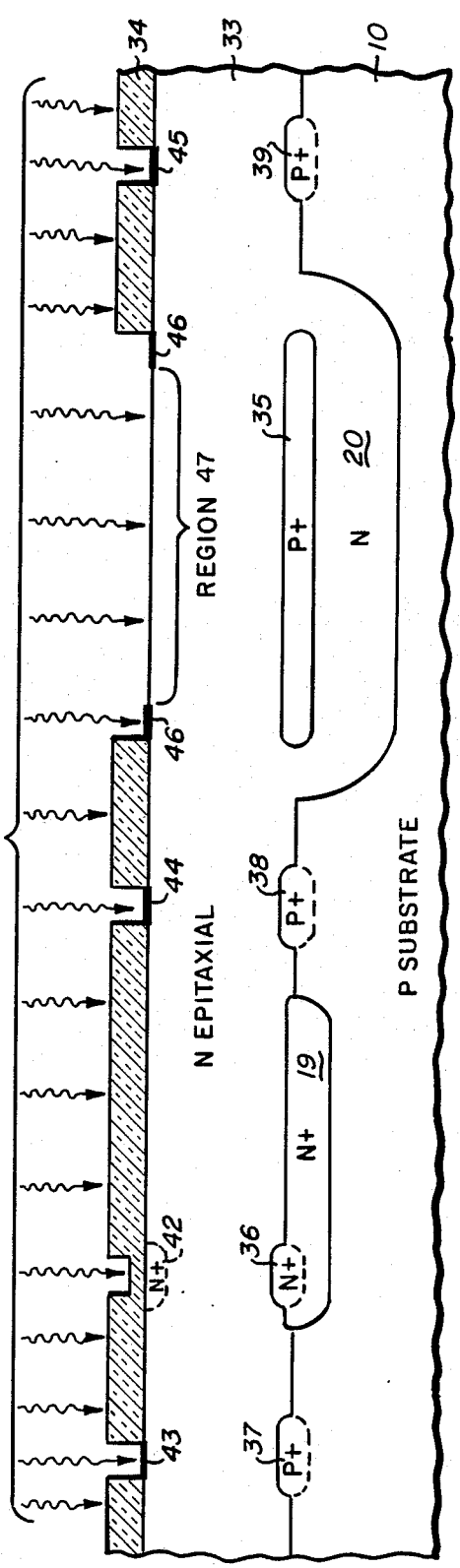

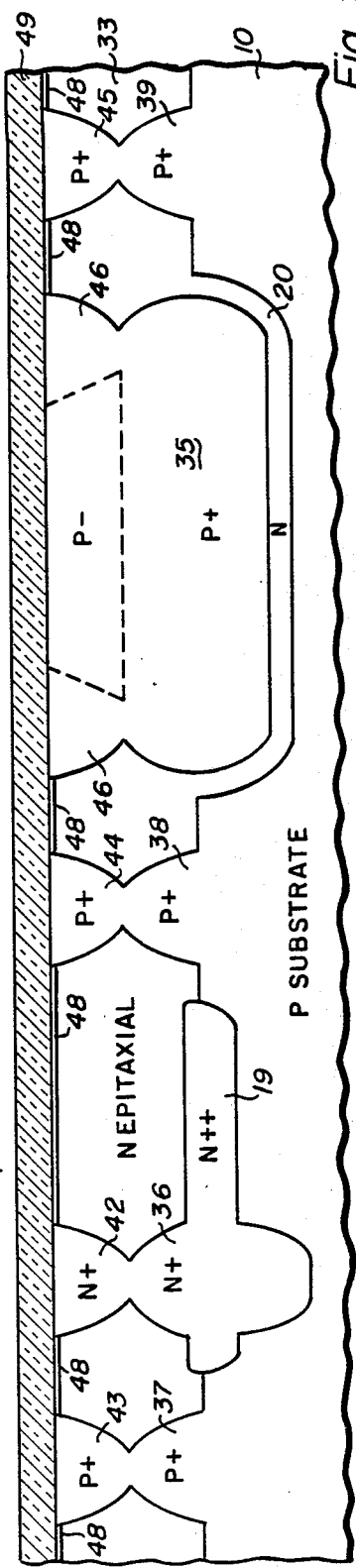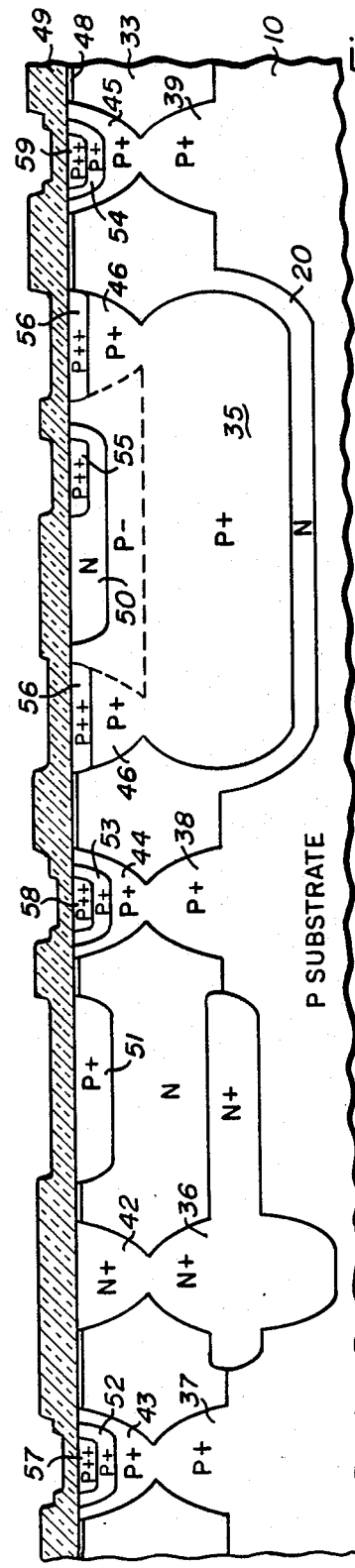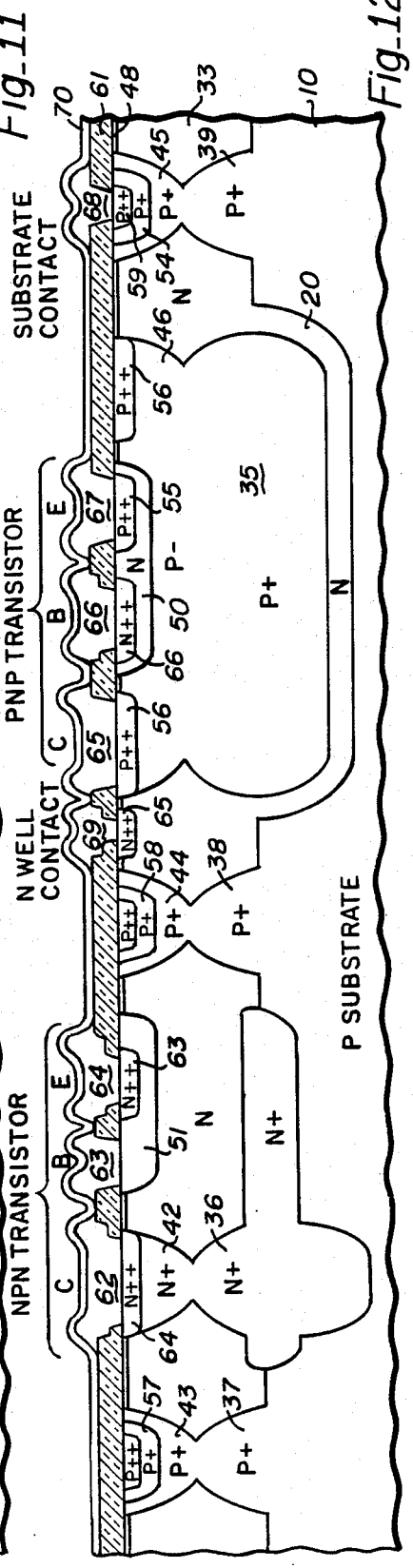

HIGH VOLTAGE COMPLEMENTARY NPN/PNP PROCESS

BACKGROUND OF THE INVENTION

Patent application 853,530 was filed Apr. 18, 1986, by J. Barry Small and Matthew S. Buynoski U.S. Pat. No. 4,733,650. It is titled A HIGH VOLTAGE COMPLEMENTARY NPN/PNP PROCESS. It relates to the fabrication of high performance PNP and NPN transistors in planar, monolithic, PN-junction-isolated, silicon integrated circuit (IC) structures. Previously, the PNP transistors were typically lateral structures or substrate dedicated collector devices. In either case, the high frequency performance of the PNP transistor was much worse than the NPN and, in the substrate-dedicated device, only emitter-follower circuits could be employed. The process disclosed in the application produced complementary devices having excellent high frequency performance and could be incorporated directly into conventional IC processing. The teaching in this application, which is assigned to the assignee of the present application, is incorporated herein by reference.

The previous IC complementary transistors, while having desirable device characteristics, had relatively limited power handling capabilities. It would be desirable to have such a process for fabricating power transistors in an IC device.

SUMMARY OF THE INVENTION

It is an object of the invention to provide an IC fabrication process in which high performance PNP and NPN power transistors can be achieved.

It is a further object of the invention to provide an IC fabrication process in which NPN power transistors can be optimized and PNP power transistors can be separately optimized.

It is a still further object of the invention to provide a process for fabricating NPN and PNP power transistors in an IC which provides performance monitors at critical stages in the process.

These and other objects are achieved in a process employing the conventional PN-junction-isolated, planar, monolithic silicon approach. The PNP power transistor devices are fabricated using a P+ collector buried layer that is created in the IC structure by applying P type impurities or dopants to the substrate wafer prior to epitaxy. At the same time the P+ collector buried layer is created it is isolated from the substrate by the establishing of a surrounding N type well region. These same P type impurities are deposited in the isolation wall regions in the substrate wafer. The conventional N++ type buried layer is created in the substrate wafer in the region where NPN power transistors are to be created. Also, an N+ contact region is applied to the substrate wafer at the end of the buried layer that shall be under the collector N+ contact area. Then the epitaxial layer is grown conventionally. The lightly doped PNP collector employs aluminum as the active species which can be applied after epitaxy in a relatively short diffusion cycle because of its high diffusion rate. The structure makes use of conventional boron up-diffusion and down-diffusion of the isolation and for contact to the periphery of the P+ collector buried layer. This permits the establishing of an isolated PNP power transistor of vertical construction. The P+ buried layer and its diffused contact will serve to reduce PNP power transistor collector resistance. The NPN power transistor is fabricated above a conventional high conductivity buried layer. However, prior to epitaxy a phosphorous diffused contact dopant is applied to the edge of the buried layer. After epitaxy a similar top surface dopant is applied in registry with the lower one. After diffusion these two dopants will blend together thereby providing a low resistance sinker contact for the NPN power transistor collector. After the isolation and contact diffusion is completed, an N type base impurity region of the PNP is located within the confines of the P well and the NPN power transistor P type base region is applied. Then a heavy concentration of P type impurities is formed to create the PNP power transistor emitter within the confines of the N type base. At the same time, P type impurities are introduced around the periphery of the P well and as a cap over the isolation region. The heavily doped NPN power transistor emitter is created within the confines of the P type base. At the same time, the NPN collector contact is capped. By these means the PNP isolation and contact doping is overcoated with heavily doped P type material and the NPN collector contact is overcoated with heavily doped N type material. The above steps are incorporated into the conventional IC process that is used to create conventional low power transistors and the other IC circuit elements such as resistors, diodes and capacitors. Since the elements of the PNP and NPN power transistors are created in separate steps, the performance of the PNP as well as the NPN power transistors can be separately optimized.

The process includes testing of the wafer at critical stages to determine the effectiveness of the previous steps. The process also includes the use of phosphosilicate glass (PSG) gettering and field threshold adjustment (FTA) along with nitride and oxide over metal for NITRIDE PLUS ™ performance.

BRIEF DESCRIPTION OF THE DRAWING

FIGS. 1–12 represent cross sections of a fragment of a silicon wafer at various stages of processing in accordance with the invention. The drawing is idealized and the vertical dimensions are exaggerated to show the various layers more clearly.

DESCRIPTION OF THE INVENTION

In the following description ion implantation is used extensively for control of silicon dopant or impurity concentration. A form of shorthand is employed to characterize the ion implant. For example, 1.2E13 @ 80 KeV describes an implant of $1.2 \times 10^{13}$ atoms per square centimeter with an energy of 80 kilo electron volts. The energy will determine the initial dopant penetration into the silicon substrate. The actual penetration will be a function of the size of the impurity ion as well as its energy. For example, the larger the ion the shallower its penetration at a given energy.

The drawings illustrate the invention by exaggerating the vertical dimensions for clarity. A fragment of an IC wafer being processed is shown in various steps in the preferred fabrication process. It is to be understood that the substrate steps that result from localized oxidation are not shown. For example, if a localized impurity diffusion is performed in an oxidizing atmosphere, an oxide will be grown at the site. Typically, when an oxide is grown to a particular thickness about half of that thickness of silicon will be consumed from the substrate. This creates a surface step, but the step is typically so small that it has little effect on the device topology. The process is still essentially planar. For example, if a 4KÅ oxide is grown in a localized region, it will create a 2KÅ depression of the silicon in that region. No attempt will be made to illustrate such steps.

In the fabrication process the starting material, as shown in FIG. 1, is a silicon wafer 10 having a P type impurity or dopant content of about $5 \times 10^{15}$ atoms per CC. An oxide 11 is grown on the surface at about 1000° C. for three hours. This oxide will be about 8KÅ thick. As shown in FIG. 1, P type substrate 10 with its oxide layer 11 is provided with a photolithographically created hole or opening 13 therein. This opening defines the region where an NPN power transistor is to be incorporated into the IC. Then antimony is implanted 2E15 @ 80 KeV. Thus, an antimony doped surface region 14 is created.

Then a new resist layer 15 is applied as shown in FIG. 2 and processed to create hole 16 therein. Oxide layer 11 is then etched to expose the surface of wafer 10 inside the hole. Phosphorous is then implanted at about 1.2E13 @ 100 KeV to create N type doped surface region 17. This region will ultimately form an N well that isolates the PNP power transistor to be incorporated into the IC.

The resist is carefully cleaned from the wafer surface and the wafer subjected to a diffusion cycle that involves heating the wafer in an oxidizing atmosphere to about 1270° C. for 8 hours. In this step, the antimony at region 14 and the phosphorous at region 17 will diffuse into the substrate 10 as shown in FIG. 3. Region 14 will produce an N++ region 19 and region 17 will produce N region 20. However, since antimony is a much slower diffuser than phosphorous its penetration into the substrate 10 will be substantially less. During this diffusion a 4KÅ oxide 18 and 18' will be grown over region 19 and 20. This diffusion temperature is the highest in the entire fabrication process so that the substrate impurity penetration shown in FIG. 3 is not altered substantially in subsequent steps.

Then, as shown in FIG. 4, a new photoresist layer 22 is applied to the wafer and holes therein are created at 23, 24, 25 and 26. Hole 23 is in registry with and lies inside region 20. It will ultimately define the collector of the PNP power transistor. Holes 24–26 represent areas where PN junction isolation regions will be fabricated. Oxide layer 11 (including its thinned region 18') will be etched through the mask holes to expose the surface of silicon substrate 10. Then, boron is implanted, about 1E15 @ 160 Kev, to create heavily doped regions 27–30.

Resist 22 is then removed from the wafer and a new resist layer 32 applied as shown in FIG. 5. It is provided with a hole 31 that, after oxide 18 is etched, exposes one end of N++ region 19. Then phosphorous is ion implanted 1E15 @ 160 KeV. This creates a heavily doped region 72.

At this point, all resist is removed from the wafer and any remaining oxide completely stripped off. The wafer is then coated with an epitaxially deposited layer of silicon as shown at 33 in FIG. 6. A conventional vapor phase deposition process, using dichlorosilane, is employed to deposit the single crystal silicon. The deposition cycle is operated to produce a layer about 14.5 microns thick and is doped N type to a conductivity of 2.5 ohm centimeters. The conductivity of the epitaxial material is selected to optimize the NPN power transistor collectors.

Immediately following epitaxial deposition the wafer is oxidized at 1000° C. for 3 hours to produce an 8kÅ oxide 34. During epitaxy and the subsequent oxidation, the impurities deposited previously into substrate 10 will diffuse upwardly into epitaxial layer 10 as shown in FIG. 6. However, they will only partially penetrate the epitaxial layer. Regions 19 and 20, which were subjected to higher temperature previously, will not diffuse appreciably further into substrate 10, but they will supply impurities that diffuse upwardly into epitaxial layer 33. For example, region 27 of FIG. 5 will produce P+ region 35 which will define the PNP power transistor collector and act as a conductive buried layer. N++ region 19 will diffuse only slightly upwardly into the epitaxial layer to provide the NPN transistor buried layer. Doped region 33 of FIG. 5 will produce N+ region 36 which extends upwardly from region 19. Region 28 of FIG. 5 will diffuse up to form isolation region 37. Region 29 of FIG. 5 will diffuse up to form isolation region 38 and region 30 of FIG. 5 will diffuse up to form isolation region 39. Since regions 37–39 are P+ type their extensions into P type substrate 10 are ohmic and are therefore shown dashed.

Then, a photoresist mask (not shown) is applied to the wafer and provided with an opening 40 that is in registry with region 36. This mask is employed to photolithographically open a hole in the oxide 34 at 40, as shown in FIG. 7. After the mask is removed the wafer is subjected to a conventional phosphorus diffusion predep that is operated to produce an N+ region 41 of about one to two ohms per square. Then, the wafer is subjected to oxidation at 950° C. which diffuses the phosphorous to create an N+ type region shown as element 42 which is shown in dashed outline in FIG. 7. This diffusion leaves an oxide inside hole 40 that is about 4KA thick as shown in FIG. 8.

Then, as shown in FIG. 8, holes are photolithographically etched through oxide 34 at locations opposite to the locations of regions 37–39 and at 46 which is a ring that is opposite the periphery of region 35. The photoresist, which is not shown, is removed and boron predeposited in the conventional manner using boron nitride. The predeposition operated to produce a 5 ohm per square boron doped layer in the exposed silicon. This deposit will occur in regions 43–45 and peripheral ring 46.

Then, another photolithographic mask (not shown) is employed to etch away the portion of oxide layer 34 that overlies region 35. The photolithographic mask is removed, thereby leaving the wafer as shown in FIG. 9, and the wafer implanted with aluminum 2E14 @ 180 KeV. At this energy substantially all of the aluminum dose is driven into the silicon surface thereby reducing aluminum loss in the subsequent diffusion step. Thus, the silicon contains both boron and aluminum in regions 43–46 and aluminum in region 47. The wafer is then subjected to a diffusion temperature of about 1150° C. for about one hour and twenty minutes. The result is shown in FIG. 10. Since aluminum is a faster diffuser than boron, it will penetrate more deeply and completely render the silicon under region 47 P type. The aluminum implant dose is selected to provide the desired resistivity of the PNP power transistor collector. Under regions 43–46 the boron diffusion down from the wafer top surface meets the upward diffusion of boron from the periphery of region 35 and from regions 37–39 so that a P+ diffusion extends completely through epitaxial layer 33, as shown in FIG. 10. While the epitaxial layer 33 is N type and while region 20 will supply N type impurities into the wafer above region 35 this contribution will be neutralized and offset by the aluminum diffusing downwardly from region 47 so the entire region inside the periphery of region 35 to the wafer surface is P type.

After the diffusion cycle, which is accomplished in a mildly oxidizing atmosphere, a residual oxide of about 4KÅ thickness exists. In the next step this oxide is stripped off of the wafer so that the silicon wafer surface is exposed.

It can be seen that, if desired, the silicon wafer surface can be probed to see if the isolation diodes are of the desired construction. Thus, an isolation process monitor is available at this stage of wafer fabrication.

This is important where high voltage transistors are to be produced. Where only low voltage devices are desired, the FTA step can be omitted. This process which produces integrated circuit trademarked NI-TRIDE-PLUS, by National Semiconductor Corporation, involves the ion implantation of arsenic 3E12 @ 40 KeV, a low dose that will raise the epitaxial layer doping of N type impurities by about an order of magnitude at the wafer surface. This layer is shown in FIG. 10 as layer 48. While this layer will significantly increase the surface doping of the epitaxial layer 33 it will have an insignificant effect upon the doped regions either present or to be fabricated later. Since arsenic is a slow diffuser in silicon this ion implant will be only slightly affected by an subsequent processing. FTA is disclosed and claimed in patent application Ser. No. 568,519 filed Jan. 5, 1984, as a continuation of Ser. No. 153,005, filed May 27, 1980. Both of these applications are assigned to the assignee of the present invention and are now abandoned. Their teaching is incorporated herein by reference. The FTA process, along with post metallization silicon nitride passivation, produces IC devices that display high long-term reliability for high voltage bipolar IC transistors.

At this point, the wafer is reoxidized at about 1000° C. for about three hours to create an 8KÅ oxide 49. Conventional planar processing is then employed to complete the IC as shown in FIGS. 11 and 12. A photolithographic mask is employed to etch oxide 49 to expose the PNP power transistor base regions and phosphorous implanted 6E14 @ 100 KeV. This is followed by a PNP power transistor base diffusion at about 1150° C. for about one hour and twenty minutes. This creates region 50.

Then a photolithographic mask is employed to have openings where the NPN power transistor bases are to be located. The oxide is etched inside the base holes to expose the silicon and a boron trichloride predep is employed to create a surface doping of about 190 ohms per square. The boron is then diffused at about 1150° C. for about thirty minutes. This produces P type base region 51 which is about 3.5 microns deep and also results in an oxide about 6.3KÅ thick. Simultaneously, with base 51, P type caps 52-54 are applied to isolation diffusions 43-45 respectively. This acts to increase isolation conductivity.

Then a photolithographic mask is employed to etch out the oxide 49 to expose the silicon where PNP power transistor emitters and collector contacts are to be fabricated along with the isolation regions. At this point, if desired, the PNP power transistor collector-base diodes can be probed as a process control to evaluate the PNP power transistor collector-base diodes. Then, an 1800Å oxide is grown over the exposed silicon surface and boron implanted 1E16 @ 75 KeV. At this energy most of the relatively heavy boron dose is absorbed in the grown oxide. A subsequent emitter diffusion at about 1100° C. for about three hours produces a P++ emitter 55 about three microns deep in a N type base 50 which is about four microns deep. While the PNP power transistor emitter is being created as described, region 56 is established to cap region 46, region 57 is established to cap region 43, region 58 is established to cap region 44 and region 59 is established to cap region 45. These P++ caps also lower the resistance in the P type diffused regions they surmount. Region 56 provides a low resistance collector contact for the PNP power transistor. Regions 57-59 act to reduce the isolation region resistance to as low a value as possible.

At this point in processing the masking oxide 49 is stripped from the wafer and a final oxide 61 is grown as shown in FIG. 12. This oxide is grown at about 950° C. for about three hours to a final thickness of about 6KÅ to produce a relatively step free surface.

Then a photolithographic mask (not shown) is applied with openings where the NPN emitters and N++ contacts are to be formed. Oxide 61 is then etched to expose the silicon surface inside the openings. If desired, the wafer can be probed as a process test to evaluate the NPN power transistor collector-base diodes. Then an emitter predep, using phosphorous oxychloride and a diffusion operated at about 1070° C. for about one-half hour, produces the N++ emitter region 63. At the same time, N++ contact regions 64 and 65 are created to provide low resistance contacts respectively to the collector of the NPN power transistor and to the N well surrounding the collector of the PNP transistor. Then the wafer is coated with an oxide deposited to a thickness of about 6300Å.

At this point in the fabrication process, a gettering process is preferred to be employed. Here the wafer along with its post emitter diffusion and deposited oxide is heated to about 1000° C. in a phosphorous oxychloride atmosphere for ten minutes followed by ten minutes in a nitrogen atmosphere. The wafer thus develops a phosphosilicate glass (PSG) layer over the surface oxide. Such a glass acts as a getter that will attract and trap impurities in the surface oxide that could otherwise act deleteriously to device operation. The presence of the PSG surface layer also acts to produce a surface melting which results in planarization flow as well as the gettering action. After gettering, the PSG, along with its entrapped impurities, is etched away in a 10:1 HF dip and rinsed.

Contact holes are photolithographically etched into the oxide to expose the silicon surface over the transistor electrodes and a layer of aluminum about a micron thick sputtered over the wafer surface. Then, the aluminum is photolithographically etched to create the desired contact pattern and metal interconnects. At this stage of fabrication, contacts 62-64 respectively represent the NPN power transistor collector, base and emitter electrodes. Contact 69 is the PNP power transistor N well connection. Contacts 65-67 respectively represent the PNP power transistor collector, base and emitter electrodes. Contact 68 is the IC substrate connection. Then, at this point in fabrication, additional layers of insulator and metal layers can be applied if multilayer metallization is desired. After the metal layer has been fabricated a layer of silicon nitride can be applied over the metal as shown in FIG. 12. Layer 70 represents the nitride passivation layer which acts along with oxide layer 61 to passivate the IC. This nitride layer applied over the contact metal operates in conjunction with the doped layer 48 to provide the benefits of NITRIDE-PLUS ™ which was described above as benefiting high voltage transistor reliability.

EXAMPLE

Power transistors were fabricated as outlined above into silicon to form IC devices. The poser transistors were made to have an area of about two square millimeters. The resulting transistors had Beta values in excess of 40 at three amperes. Their $BV_{cbo}$ exceeded sixty volts and their $F_T$ values exceeded fifty MHz. The transistors displayed long term reliability after repeated cycling over temperature with applied bias.

The invention has been described and its operation detailed. When a person skilled in the art reads the foregoing description, alternatives and equivalents, within the spirit and intent of the invention, will be apparent. Accordingly, it is intended that the scope of the invention be limited only by the following claims.

We claim:

1. A process for making a monolithic silicon, planar, PN-junction-isolated integrated circuit that contains high performance PNP power transistors along with high performance PNP power transistors, said process including the steps:

starting with a wafer of a first conductivity type and having a masking oxide thereon;

etching said oxide photolithographically to create holes in said oxide where NPN and PNP power transistors are to be located;

applying a first dopant to said wafer in those regions where NPN power transistors are to be located; wherein said first dopant is capable of doping said substrate to the opposite conductivity type.

applying a second dopant to said wafter in those regions where PNP power transistors are to be located wherein said second dopant is capable of doping said substrate to said opposite conductivity type, and is a faster diffuser than said first dopant, diffusing said first and second dopants into said substrate at a relatively high temperature, said relatively high temperature being the highest temperature that said process will employ, where said second dopant will be diffused to a second depth and said first dopant will be diffused to a first depth that is less than said second depth and simultaneously regrowing said oxide;

etching said regrown oxide photolithographically to create holes therein where said PNP power transistors are to be located and where isolation regions are to be located;

applying a third dopant to said water wherein said third dopant is capable of overcoming said second dopant and of heavily doping said substrate to said first conductivity type;

applying a fourth dopant to said wafer where said NPN power transistors collector contacts are to be located and in registry with a portion of said first dopant, said fourth dopant being of the same conductivity type as said first dopant and of substantially higher diffusion rate;

stripping any oxide from said wafer to render it oxide free;

growing an epitaxial layer on said oxide-free wafer, said epitaxial layer having said opposite conductivity type and a resistivity selected to optimize said NPN power transistor collectors;

forming a first masking oxide on said epitaxial layer;

etching said first masking oxide photolithographically to create holes therein in registry with said fourth dopant and applying a firth dopant having the same character as said fourth dopant;

diffusing said fifth dopant to partially penetrate said epitaxial layer and to regrow an oxide inside the holes in said first masking oxide;

etching said first masking oxide photolithographoically to create and further to create holes that are in registry with the periphery of those regions where said PNP power transistors are to be created;

applying a sixth dopant to said wafer wherein said sixth dopant has the same character as said third dopant;

etching said first masking oxide to create additional holes in those regions where said PNP power transistors are to be created;

applying a seventh dopant in the thud created holes in said formed masking oxide, said seventh dopant being a relatively fast diffuser that will dope said epitaxial layer to said first conductivity type and selecting the dose of said seventh dopant to optimize the collectors of said PNP transistors;

diffusing said sixth and seventh dopants into said epitaxial layer to an extent where the contact said third dopant which diffused away from said substrate and into said epitaxial layer and wherein the diffusion of said sixth and seventh dopants causes said fourth and fifth dopants diffuse and merge together in said epitaxial layer;

stripping all oxide from the surface of said wafer subsequent to the diffusing of said sixth and seventh dopants;

forming a second planar masking oxide on said water;

forming an NPN power transistor over the region formed by diffusing said second impurity whereby said fourth and fifth dopants provide a difused region that creates a low collector resistance in said NPN power transistor;

forming a PNP power transistor over the region formed by diffusing said second impurity whereby said third and sixth dopants provide diffused regions that create a low collector resistance in said PNP power transistor; and forming metal contacts on top of said second planar masking oxide to provide connections to the electrodes of said NPN and PNP power transistors.

2. The process of claim 1 further comprising the steps:

subsequent to the stripping of said oxide from said wafer, and prior to forming said second planar masking oxide probing said wafer to evaluate said diffusion step that follows the deposition of said seventh dopant.

3. The process of claim 1 further comprising the steps:

subsequent to the stripping of said first masking oxide from said wafer, and prior to forming said second planar masking oxide, performing the additional steps:

applying a field threshold adjustment ion implant of a slow diffusing impurity selected from the group consisting of arsenic and antimony; and after said step of forming metal contacts, applying a layer of silicon nitride over said metal contacts.

4. The process of claim 3 wherein said slow diffusing impurity is ion implanted and the dose selected to raise the surface doping level of the silicon substrate by about an order of magnitude.

5. The process of claim 1 wherein said first through said fourth and said seventh dopants are applied by ion implantation and are subsequently driven into said silicon by a diffusion step.

6. The process of claim 1 wherein said second, fourth and fifth dopants are composed of phosphorous, said first dopant is composed of antimony, said third and sixth dopants are composed of boron and said seventh dopant is composed of aluminum.

7. The process of claim 1 wherein said wafer is probed during the formation of said PNP transistors to evaluate their collector-base junction formation.

8. The process of claim 1 wherein said wafer is probed during the formation of said NPN transistors to evaluate their collector-base junction formation.

* * * * *